(12) United States Patent
Su

(10) Patent No.: US 11,307,240 B2
(45) Date of Patent: Apr. 19, 2022

(54) ANALYSIS METHOD FOR SEMICONDUCTOR DEVICE

(71) Applicant: Shanghai Huali Integrated Circuit Mfg. Co., Ltd., Shanghai (CN)

(72) Inventor: Ping-Hsun Su, Shanghai (CN)

(73) Assignee: Shanghai Huali Integrated Circuit Mfg. Co. Ltd., Shanghai (CN)

( * ) Notice: Subject to any disclaimer, the term of this patent is extended or adjusted under 35 U.S.C. 154(b) by 87 days.

(21) Appl. No.: 16/828,991

(22) Filed: Mar. 25, 2020

(65) Prior Publication Data

US 2020/0309842 A1  Oct. 1, 2020

(51) Int. Cl.
  *G01R 31/26* (2020.01)
  *G06F 17/40* (2006.01)
  *H01L 21/66* (2006.01)

(52) U.S. Cl.
  CPC ......... *G01R 31/2621* (2013.01); *G06F 17/40* (2013.01); *H01L 22/12* (2013.01)

(58) Field of Classification Search
  CPC ....... H01L 21/00; H01L 2221/00; G01R 1/00; G06F 1/00; G06N 3/00
  See application file for complete search history.

(56) References Cited

U.S. PATENT DOCUMENTS

| | | | | |
|---|---|---|---|---|
| 9,009,638 B1* | 4/2015 | Hook | ............ | G06F 30/367 |
| | | | | 716/111 |
| 2010/0141948 A1* | 6/2010 | Cohen | ............ | G01B 11/0625 |
| | | | | 356/369 |
| 2014/0073130 A1* | 3/2014 | Hilscher | ............ | H01L 21/28052 |
| | | | | 438/655 |
| 2014/0201699 A1* | 7/2014 | Haensch | ............ | G06F 30/20 |
| | | | | 716/136 |
| 2015/0276850 A1* | 10/2015 | Lu | ............ | G06F 30/36 |
| | | | | 702/65 |
| 2016/0342719 A1* | 11/2016 | Reid | ............ | G06F 30/367 |

* cited by examiner

*Primary Examiner* — Jermele M Hollington
*Assistant Examiner* — Temilade S Rhodes-Vivour
(74) *Attorney, Agent, or Firm* — Adsero IP

(57) ABSTRACT

The present disclosure provides an analysis method for a semiconductor device for analyzing a plurality of process parameters for manufacturing a HKMG fin field effect transistor. The analysis method specifically includes: establishing a plurality of process parameter models by grouping the plurality of process parameters in pairs; performing sensitivity analysis on each of the process parameter models; extracting a plurality of key process parameter models from the plurality of process parameter models based on the results of the sensitivity analysis; and performing data mining on the plurality of key process parameter models to determine a plurality of key process parameters and their correlations among the plurality of key process parameters. According to the analysis method provided by the present disclosure, related process parameters are highlighted by data mining and grouping, and the source of process parameter changes is explained. It is possible to adjust the process.

14 Claims, 5 Drawing Sheets

ANALYSIS METHOD FOR SEMICONDUCTOR DEVICE

CROSS-REFERENCES TO RELATED APPLICATIONS

The present application claims priority to Chinese Patent Application No. 201910250532.3, filed on Mar. 29, 2019, entitled "Analysis method for semiconductor device", which is incorporated by reference herein for all purposes.

FIELD

The present disclosure relates to the field of semiconductors, and more particularly to the analysis and optimization of on-line process parameters for the manufacture of semiconductor devices.

BACKGROUND

The introduction of FinFET (Fin-Field Effect Transistor) is a major advancement in the semiconductor industry of the 16 nm technology generation. Although the 16-nm high dielectric material metal gate fin field effect transistor (HKMG FinFET, High-K Metal Gate FinFET) is being introduced into mass production, there is still much room for improvement in process optimization, for example, variations in transistor electrical characteristics caused by process variations, and the effects of process variations on components and circuits caused by the latest 3D structures and new processes in the manufacturer.

Although, in terms of theoretical research, there are already related literatures discussing the optimization of the above process, most of the existing related literatures use computer simulation to simulate the variation of process and component electrical characteristics. Moreover, only a few known process steps have been discussed, and all process steps have not been integrated into a comprehensive analysis, and the interaction effects of the processes have not been studied. Therefore, there is no corresponding solution for optimizing the process.

Accordingly, it is desirable to provide an analysis method that can analyze the interaction between processes by means of the processing power of big data analysis, to find the key source of process variation, and provide a possibility for subsequent optimization of the process.

SUMMARY OF THE DISCLOSURE

A brief summary on one or more aspects is given below to provide the basic understanding for these aspects. This summary is not an exhaustive overview of all the contemplated aspects and is neither intended to indicate critical or decisive elements of all aspects nor to attempt to define the scope of any or all aspects. Its sole purpose is to present some concepts of one or more aspects in a simplified form as a preface for a more detailed description presented later.

In order to make up for the fact that there is no theoretical and practical operation in the industry to analyze the interaction between the processes of HKMG FinFETs, and there is no way to find the source of process variation, the present disclosure provides an analysis method for analyzing a plurality of process parameters for manufacturing a HKMG fin field effect transistor, and the foregoing analysis method specifically includes:

establishing a plurality of process parameter models by grouping the plurality of process parameters in pairs;

performing sensitivity analysis on each of the process parameter models;

extracting a plurality of key process parameter models from the plurality of process parameter models based on the results of the sensitivity analysis; and performing data mining on the plurality of key process parameter models to determine correlations among a plurality of key process parameters of the plurality of process parameters.

In an embodiment of the foregoing analysis method, optionally, performing the sensitivity analysis further comprises:

calculating the covariance of each of the process parameter models; and calculating a correlation coefficient of each of the process parameter models based on the covariance.

In an embodiment of the foregoing analysis method, extracting the plurality of key process parameter models further comprises:

extracting from the plurality of process parameter models a process parameter model whose absolute value of the correlation coefficient is greater than a preset threshold as the key process parameter model.

In an embodiment of the foregoing analysis method, the performing the data mining further comprises:

performing the data mining based on correlation coefficients of the plurality of key process parameter models to determine correlations among the key process parameters.

In an embodiment of the foregoing analysis method, performing the data mining based on the correlation coefficients of the plurality of key process parameter models further comprises:

establishing a correlation coefficient matrix of the plurality of key process parameter models by using a correlation coefficient of the plurality of key process parameter models as a matrix element; and determining the correlations among the key process parameters based on the correlation coefficient matrix.

In an embodiment of the foregoing analysis method, determining the correlations among the key process parameters based on the correlation coefficient matrix further comprises:

performing agglomerative hierarchical clustering based on the correlation coefficient matrix.

In an embodiment of the foregoing analysis method, the correlation coefficient is a Pearson correlation coefficient, and the correlation coefficient matrix is a Pearson correlation coefficient matrix.

In an embodiment of the foregoing analysis method, establishing the plurality of process parameter models further comprises:

obtaining a plurality of specific values for each of the process parameters; and establishing the plurality of process parameter models based on the plurality of process parameters and respective corresponding plurality of specific values.

In an embodiment of the foregoing analysis method, the analysis method further comprises:

determining source process parameters based on the correlations among the key process parameters; and adjusting the source process parameters to optimize the plurality of process parameters.

The present disclosure also provides a computer apparatus comprising a memory, a processor and a computer program stored on the memory and operable on the processor, and the processor executes the computer program to perform the steps of the analysis method according to any one of the foregoing analysis methods.

The present disclosure also provides a computer readable storage medium having stored there on a computer program, and the computer program is executed by a processor to perform the steps of the analysis method according to any one of the foregoing analysis methods.

According to the analysis method provided by the present disclosure, by performing sensitive analysis on a plurality of process parameters for manufacturing a HKMG fin field effect transistor, key process parameters in a plurality of process parameters are obtained, and data mining is performed on a plurality of key process parameters, thereby it possible to highlight and group the relevant online process parameters. Through the analysis method provided by the disclosure, the source of the online process parameter change can be revealed, thereby providing the possibility for subsequent adjustment of the process and optimization of the process.

REFERENCE SIGNS a top-fin width
b bottom-fin width
c fin height
θ top-fin corner angle
d gate length
e1 gate-spacer-1 thickness
e2 gate-spacer-2 thickness
f S/D proximity
g S/D depth
h S/D Epi-overgrowth height
i lateral S/D SEG weight
j HK/IL thickness
k gate height
HKMG High-K Metal Gate
Gate gate
Fin fin
Ct contact

DETAILED DESCRIPTION

In the following detailed description, numerous specific details are set forth to provide a more thorough understanding of the present disclosure. Embodiments of the present disclosure may be practiced without limitations from these specific details. In other words, well-known structures and devices are shown in a block diagram form and are not shown in detail, to avoid obscuring the present disclosure.

The reader is cautioned as to all files and documents which are filed at the same time as this specification and which are open for the public to consult, and the contents of all such files and documents are incorporated herein by reference. Unless directly stated otherwise, all features disclosed in this specification (including any of the appended claims, the abstract, and the accompanying drawings) may be replaced by alternative features serving the same, equivalent, or similar purposes. Therefore, unless expressly stated otherwise, each of the features disclosed is only one example of a group of equivalent or similar features.

Figure 1:
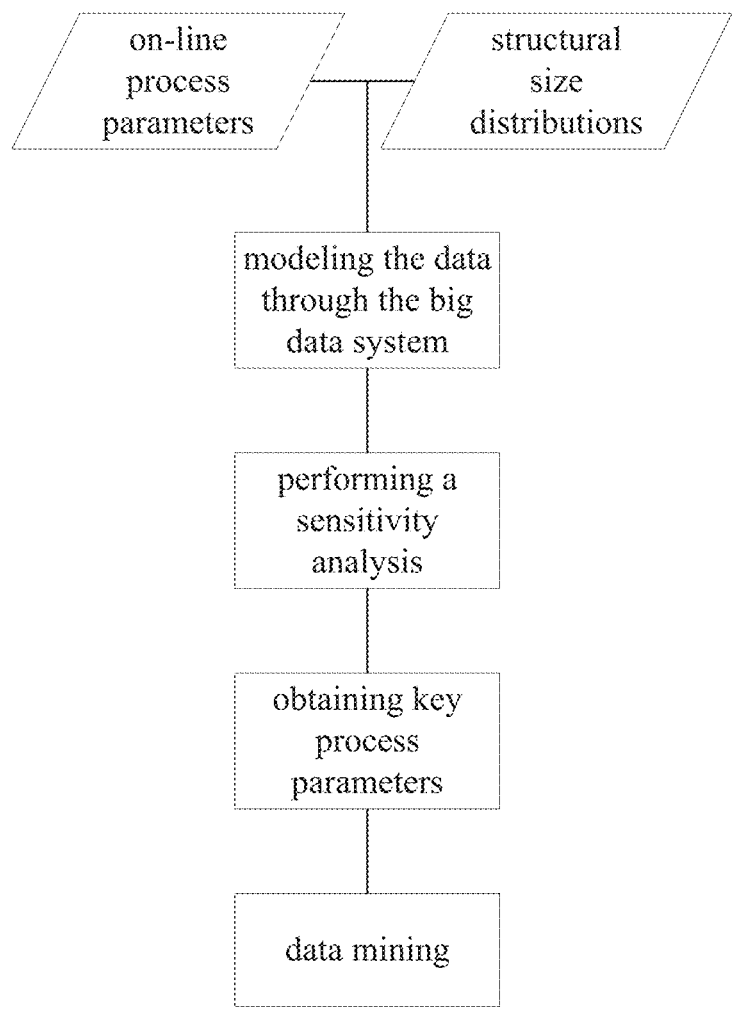
FIG. 1 shows a flow chart of the analysis method provided by the present disclosure.

As described above, the present disclosure provides an analysis method of a semiconductor device for analyzing a plurality of process parameters for manufacturing a HKMG fin field effect transistor. Please refer to FIG. 1, FIG. 1 shows a flow of an analysis method according to the present disclosure. The analysis method according to the present disclosure specifically includes, in step 1, first defining on-line process parameters for fabricating a HKMG fin field effect transistor, and obtaining structural size distributions of the HKMG fin field effect transistor corresponding to the on-line process parameters.

In the above step 1, the online process parameters are based on online testing, which is the opposite of offline testing. The wafer in which the semiconductor device is located is tested offline after the manufacturing is completed. After the test, the wafer does not return to the process line to continue the next manufacturing process. After the online test, the wafer needs to continue to the next site for manufacturing. By performing an online test, the structural size distributions of the HKMG fin field effect transistor corresponding to the online process parameters, that is, the specific values corresponding to the online process parameters can be obtained. Moreover, since it is an online test, it can correct errors in time when the process is found to be mutated, thereby avoiding economic losses.

In one embodiment, in the prior art, the manufacturing process of the fin field effect transistor can be generally divided into at least the following eight steps:
1、Fin formation
2、Dummy gate formation
3、S/D implantation
4、S/D EPI growth
5、Gate replacement
6、Hi-K Metal Gate formation
7、S/D Contact formation
8、BEOL Correspondingly, the process parameters selected in the process step may specifically include at least:

| 1,  | Top-Fin Width            | a  |
| --- | ------------------------ | -- |
| 2,  | Bottom-Fin Width         | b  |
| 3,  | Fin Height               | c  |
| 4,  | Top-Fin Corner Angle     | θ  |
| 5,  | Gate length              | d  |
| 6,  | Gate-Spacer-1 Thickness  | e1 |
| 7,  | Gate-Spacer-2 Thickness  | e2 |
| 8,  | S/D Proximity            | f  |
| 9,  | S/D Depth                | g  |
| 10, | S/D Epi-Overgrowth Height| h  |
| 11, | Lateral S/D SEG Wight    | i  |
| 12, | HK/IL Thickness          | j  |
| 13, | Gate Height              | k  |

The parameters 1-4 correspond to the Fin formation step. Parameters 5-7 correspond to the steps of forming a dummy gate, S/D implantation, S/D EPI growth, and the gate replacement. Parameters 8-11 correspond to the steps of S/D implantation and S/D EPI growth. Parameters 12-13 correspond to the step of forming a high-k metal gate.

Figure 2A:
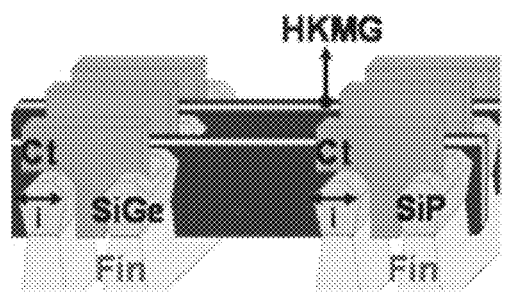
FIG. 2A is a schematic view showing the structure of a fin field effect transistor analyzed by the present disclosure.
Figure 2B:
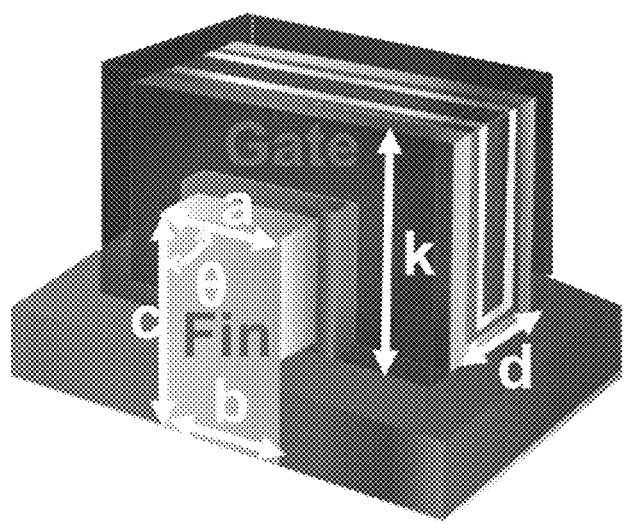
FIG. 2B is a schematic view showing the structure of a fin field effect transistor analyzed by the present disclosure.
Figure 2C:
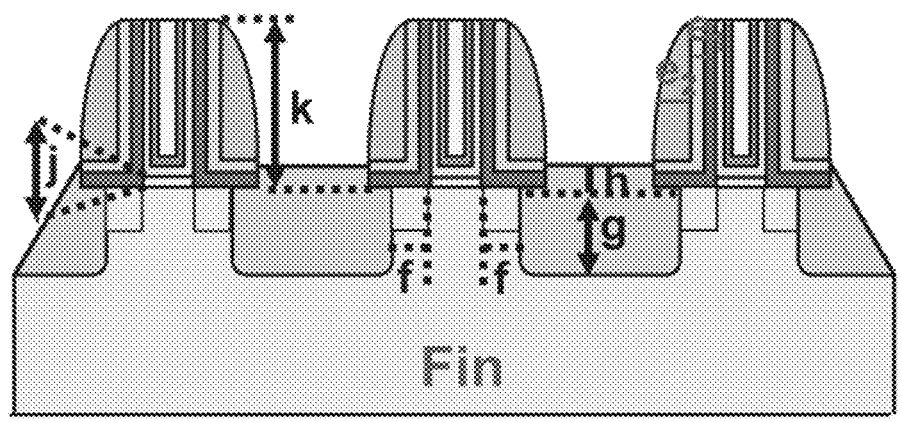
FIG. 2C is a schematic view showing the structure of a fin field effect transistor analyzed by the present disclosure.

Please refer to the different aspects of the fin field effect transistor structure shown in FIGS. 2A-2B to understand the specifics of the above process parameters. By obtaining and collecting the above data of HKMG FinFET, it provides a basis for subsequent analysis to find the origin of process variation.

Then, after obtaining and collecting relevant data, performing step 2, modeling the data through the big data system, In one embodiment, may include a parameter model between each process parameter and a plurality of specific values thereof, as well as a process parameter model of a parameter model of one process parameter and a parameter model of another process parameter.

For example, assume that the process parameters are IL1 to ILn, and each process parameter has N specific values. The parameter model between each process parameter and multiple specific values is IL1's own model. The process parameter models of a parameter model of one process parameter and a parameter model of another process parameter are the models such as IL1-IL2.

After the data are modeled, perform step 3 to perform a sensitivity analysis on the established models. In one embodiment, the sensitivity analysis further includes calculating a covariance of each process parameter model, and calculating a correlation coefficient of each process parameter model based on the covariance.

In one embodiment, calculating the covariance of each process parameter model can be calculated by the following formula:

$$\text{cov}(IL_1, IL_2) = \sigma_{IL_1 IL_2} = E[(IL_1 - u_1)(IL_2 - u_2)]$$

In one embodiment, E represents the expected value; u1, u2 are the mean values of IL1 and IL2, respectively.

Covariance is used in probability theory and statistics to measure the overall error of two variables. The covariance represents the total error of two variables, which is different from the variance that only represents the error of one variable. If the two variables change in the same trend, that is, if one of them is greater than its own expected value and the other is greater than its own expected value, the covariance between the two variables is a positive value. If the two variables change in opposite directions, that is, one is greater than its own expected value and the other is less than its own expected value, the covariance between the two variables is a negative value.

Intuitively, the covariance represents the expectation of the overall error of the two variables. If the trends of the two variables are the same, that is, if one of them is greater than its own expectation and the other is greater than its own expectation, then the covariance between the two variables is positive; if the two variables change in the opposite direction, that is, if one of the variables is greater than its own expected value and the other is less than its own expected value, the covariance between the two variables is a negative value.

Further, the correlation coefficient of each process parameter model calculated based on the covariance can be calculated by the following formula:

$$\text{corr}(IL_1, IL_2) = \rho_{IL_1 IL_2} = \frac{\text{cov}(IL_1, IL_2)}{\sqrt{\text{cov}(IL_1)\text{cov}(IL_2)}}$$

and:

$$\text{cov}(IL_1) = \text{cov}(IL_1, IL_1) = \sigma_{IL_1 IL_1} = E[(IL_1 - u_1)(IL_1 - u_1)]$$

$$\text{cov}(IL_2) = \text{cov}(IL_2, IL_2) = \sigma_{IL_2 IL_2} = E[(IL_2 - u_2)(IL_2 - u_2)]$$

And E represents the expected value; u1, u2 are the mean values of IL1 and IL2, respectively.

The correlation coefficient is a statistical indicator used to reflect the closeness of the correlation between variables. Due to the different research objects, the correlation coefficient has many definitions. The Pearson correlation coefficient is more commonly used. The embodiments provided by the present invention are also based on the Pearson correlation coefficient. The Pearson correlation coefficient is the first statistical indicator designed by the statistician Carl Pearson. It is the amount of linear correlation between the variables. The Pearson correlation coefficient is calculated by the product-moment method. Based on the dispersion of the two variables and their respective averages, the two dispersions are multiplied to reflect the correlation between the two variables, and the linear single correlation coefficient is studied.

It can be seen from the above calculation method that the Pearson correlation coefficient between IL1 and IL2 is the covariance of IL1 and IL2 divided by the standard deviation of IL1 and the standard deviation of IL2.

Therefore, the correlation coefficient can also be regarded as a covariance, which is a special covariance that eliminates the influence of dimension of the two variables and has been standardized. Because of being a special covariance, the Pearson correlation coefficient has the following characteristics:

1. It can reflect whether the two variables change in the same direction or in the opposite direction. Positive represents the change is in the same direction, negative represents the change is in the opposite direction.

2. Because it is the covariance after standardization, more importantly, it eliminates the influence of the magnitude of the change of the two variables, but simply reflects the degree of similarity between the two variables per unit change.

In general, when the correlation coefficient of IL1 and IL2 is 1, it shows that the positive similarity of the two variables is the largest, that is, IL1 is doubled and IL2 is doubled, or IL1 is halved and IL2 is halved. That is, it is completely positive correlation (with IL1 and IL2 as the horizontal and vertical axes, a straight line with a positive slope can be drawn, so IL1 and IL2 are linear).

As their correlation coefficient decreases, the similarity between the changings of the two variables decreases. When the correlation coefficient is 0, there is no similarity between the changings of the two variables, that is, the two variables are irrelevant.

When the correlation coefficient continues to decrease, to be less than 0, the two variables begin to have a reverse similarity. As the correlation coefficient continues to decrease, the reverse similarity will gradually become larger.

When the correlation coefficient is −1, the reverse similarity of the two variables is the largest, that is, IL1 is doubled and IL2 is halved, or IL1 is halved and IL2 is doubled. That is, it is completely negatively correlated (using IL1 and IL2 as the horizontal and vertical axes, a straight line with a negative slope can be drawn, so IL1 and IL2 are also linear).

That is to say, the larger the absolute value of the Pearson correlation coefficient (the closer to 1 or −1) is, the stronger the correlation is. Conversely, the closer to 0 the Pearson correlation coefficient is, the weaker the correlation is.

Therefore, after performing the sensitivity analysis, step 4 is performed to obtain key process parameters and key process parameter models. Based on the above analysis, the process parameter models whose absolute value of the correlation coefficient is greater than the preset threshold are extracted from the plurality of process parameter models as the key process parameter models.

That is to say, when corr(ILi, ILj) is greater than the preset threshold, Ili-ILj can be considered as a key process parameter model; corr(ILi, ILj) can be considered as part of the key process parameter model, that is the Correlation coefficient of the key process parameter model; and ILi, ILj can be considered as key process parameters.

In some embodiments, through the above analysis, the Pearson correlation coefficient between the two variables is in the range of −1 to 1 interval. Therefore, after the absolute value is taken, the preset threshold is in the range of 0 to 1. The set of the preset threshold may be in the range of 0 to 1 according to the actual test requirements, which is not limited by the present disclosure.

After the key process parameter models having been extracted, perform step 5 for data mining. Furthermore, the analysis method provided by the present disclosure performs data mining based on correlation coefficients of key process parameter models.

Further, in the data mining step, the correlation coefficient matrix is first established by using the correlation coefficient of the above key process parameter model as a matrix element. The specific construction method refers to the following formula:

$$\rho_{IL} = \begin{bmatrix} \text{corr}(IL_1, IL_1) & \text{corr}(IL_1, IL_2) & \cdots & \text{corr}(IL_1, IL_{n-1}) & \text{corr}(IL_1, IL_n) \\ \text{corr}(IL_2, IL_1) & \text{corr}(IL_2, IL_2) & \cdots & \text{corr}(IL_2, IL_{n-1}) & \text{corr}(IL_2, IL_n) \\ \cdots & \cdots & \cdots & \cdots & \cdots \\ \text{corr}(IL_{n-1}, IL_1) & \text{corr}(IL_{n-1}, IL_2) & & \text{corr}(IL_{n-1}, IL_{n-1}) & \text{corr}(IL_{n-1}, IL_n) \\ \text{corr}(IL_n, IL_1) & \text{corr}(IL_n, IL_2) & & \text{corr}(IL_n, IL_{n-1}) & \text{corr}(IL_n, IL_n) \end{bmatrix}.$$

Subsequently, Agglomerative Hierarchical Clustering (AHC) is performed based on the correlation coefficient matrix to determine the correlation between key process parameters.

Further, although a plurality of key process parameters has been acquired according to the correlation coefficient in step 4, it is found from practice that a large number of key process parameters still exist. And each key process parameter may interact with each other. To extract the hidden correlation between complex and large amount of online process parameters, data mining (DM) techniques are applied to highlight and group related online process parameters. According to data mining, the source of online process parameter changes, that is, the source process parameters, can be revealed.

In one embodiment, agglomerative hierarchical clustering is a bottom-up hierarchical clustering method that calculates the distance between classes based on a specified similarity or distance definition. The agglomerative hierarchical clustering method first treats each sample point as a single cluster, and then merges two clusters with the closest "distance" at each step (the distance here can be regarded as the definition of cluster proximity) until all the clusters are classified into the same class. Hierarchical clustering is often represented by a dendrogram (using "single-chain" clustering), from which the relationship between the cluster and its sub-clusters, and the order in which the clusters are merged and split are visible. For 2D sample points, it can also be represented by a similar Nested Cluster Diagram.

In one embodiment, the basic agglomerative hierarchical clustering is the basis of the clustering hierarchical clustering algorithm family. The main idea is to start from the individual points as clusters and merge the two clusters with the closest "distance" until only one cluster remains. As follows:

Calculate the proximity matrix if needed;
Repeat:
Merge the two closest clusters;
Updating the proximity matrix to reflect the proximity between the new cluster and the original cluster;
until: Only one cluster remains.

In the embodiment provided by the present disclosure, the proximity matrix may be the correlation coefficient matrix established above. Data mining based on agglomerative hierarchical clustering can group key process parameters and determine source process parameters.

Figure 3:
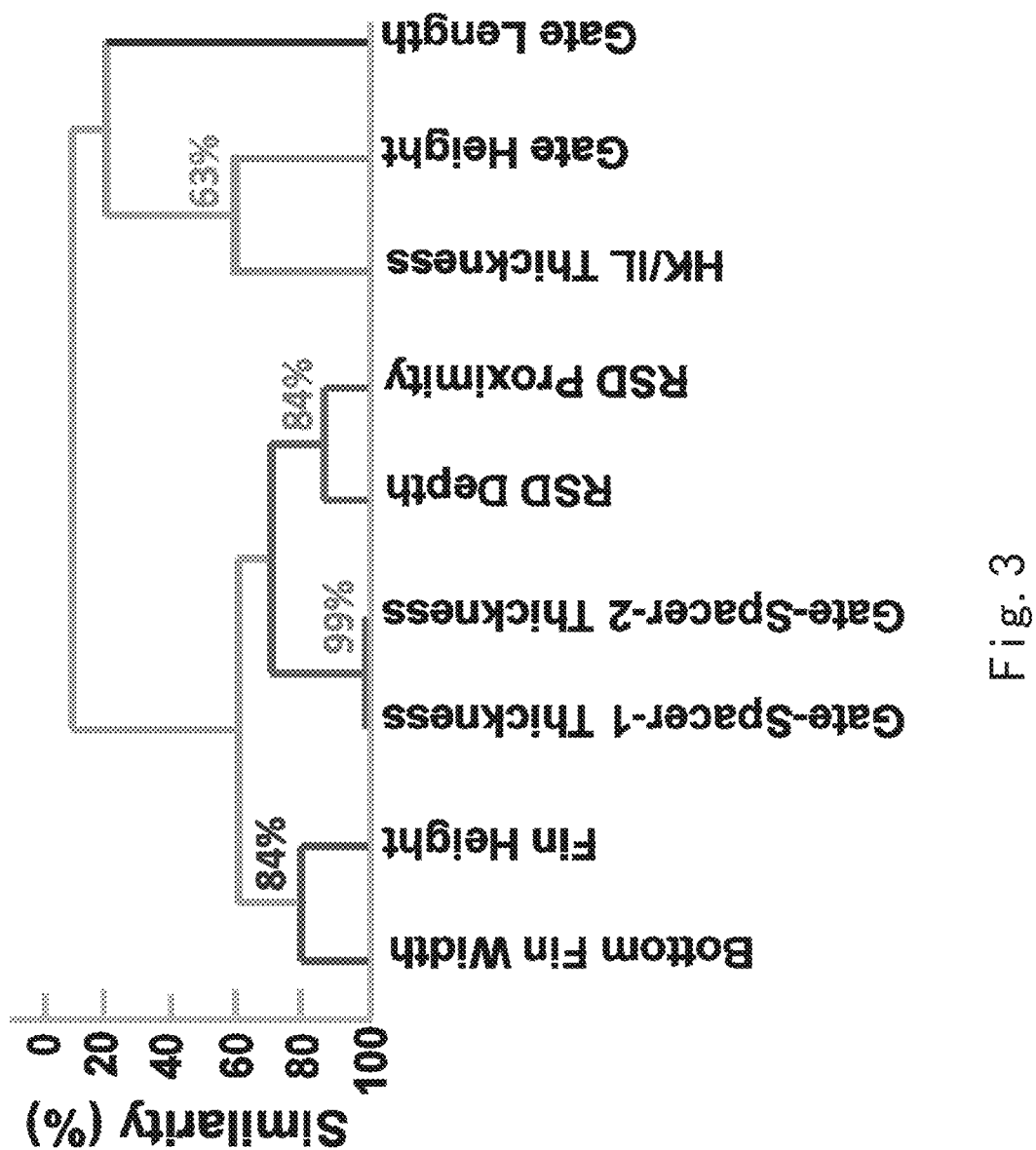
FIG. 3 is a schematic diagram showing the result of performing data mining by the analysis method provided by the present disclosure.

Please refer to FIG. 3, which shows the results obtained after data mining. After several online process parameters are processed in the above several steps, the key parameters therein can be determined, and the key parameters are grouped to determine the correlation between the key parameters. As can be seen from FIG. 3, for the HKMG fin field effect transistor, the bottom-fin width, the fin height, the gate-spacer-1 thickness, the gate-spacer-2 thickness, the S/D depth, the S/D proximity, the HK/IL thickness, the gate height and the gate length are key parameters. Moreover, based on the grouping of the above key parameters and the sequence of processes, the source process parameters of the process parameters can be determined.

According to the determined source process parameters, the subsequent plurality of parameters can be optimized by adjusting the source process parameters, so that the HKMG fin field effect transistor has better characteristics.

For example, if the S/D depth of the device is found to be unsatisfactory, in addition to adjusting the S/D depth itself, it is also necessary to determine the source process parameters. According to the structure obtained by the analysis method provided by the present disclosure, the S/D depth is also associated with the gate-spacer-1 thickness and the gate-spacer-2 thickness. Therefore, it is possible to try to adjust the thickness of the first gate spacer and the thickness of the second gate spacer. Further, if after adjusting the thickness of the first gate spacer and the thickness of the second gate spacer, the device still does not meet the requirement, it can be known that the thickness of the first gate spacer and the thickness of the second gate spacer are associated with the bottom-fin width and the fin height. The first gate spacer thickness and the second gate spacer thickness can be improved by attempting to adjust the bottom-fin width and the fin height to further improve the source drain depth.

After data mining has been performed, the above data mining results can also be verified to determine that data mining is accurate and effective.

Figure 4A:
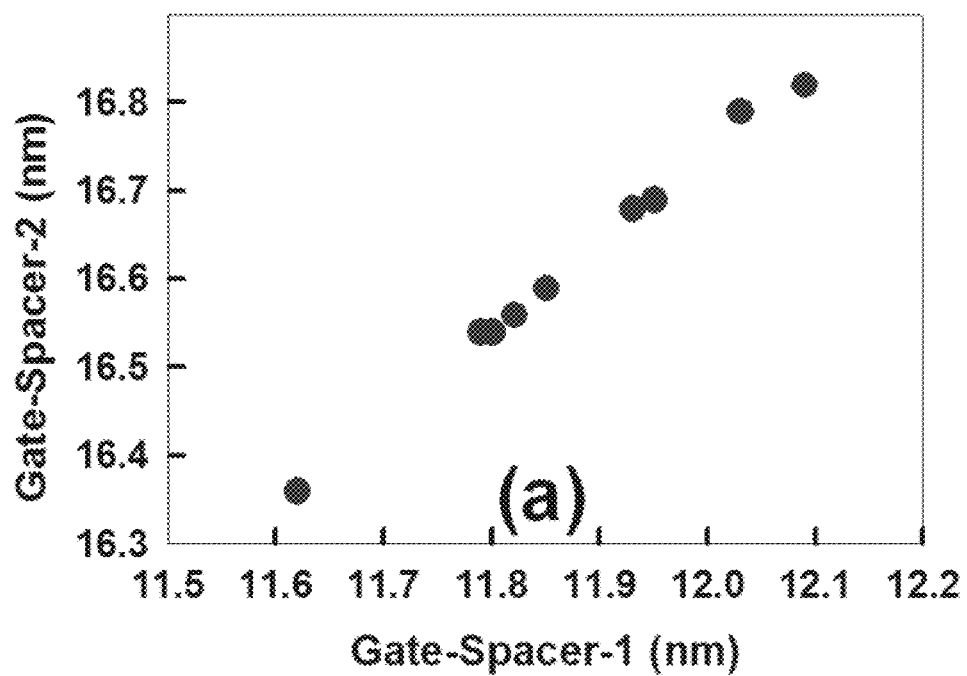
FIG. 4A verifies an aspect of the results shown in FIG. 3.

Please refer to FIG. 4A-FIG. 4D. FIG. 4A shows the relationship between the gate-spacer-1 thickness and the gate-spacer-2 thickness. As can be seen from FIG. 4A, there is indeed a better linear correlation between the gate-spacer-1 thickness and the gate-spacer-2 thickness.

Figure 4B:
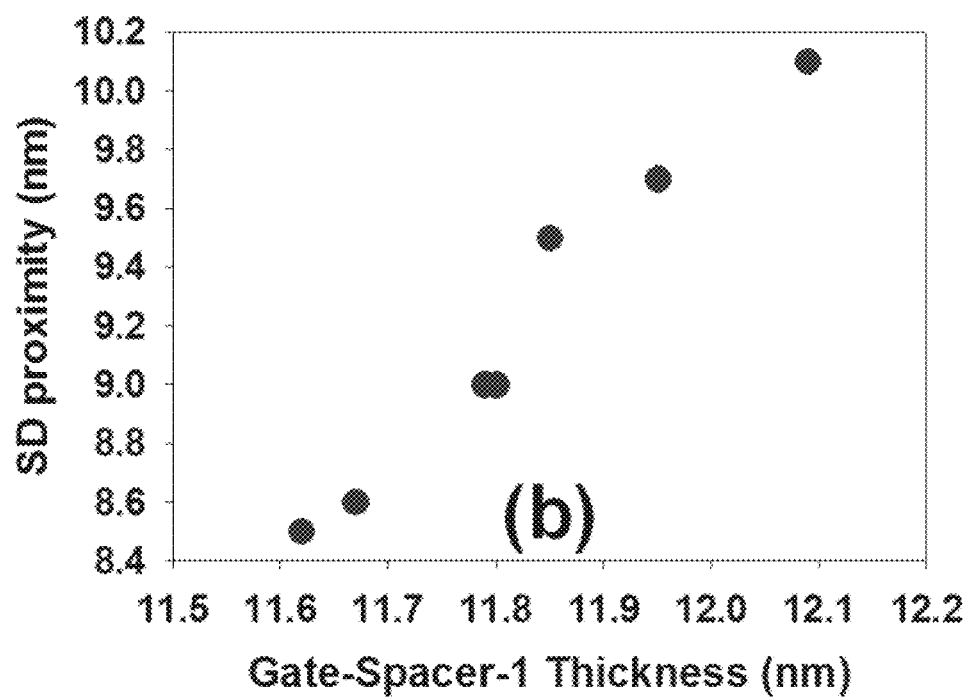
FIG. 4B verifies an aspect of the results shown in FIG. 3.

FIG. 4B shows the relationship between the gate-spacer-1 thickness and the S/D proximity. As can be seen from FIG. 4B, there is indeed a better linear correlation between the gate-spacer-1 thickness and the S/D proximity.

Figure 4C:
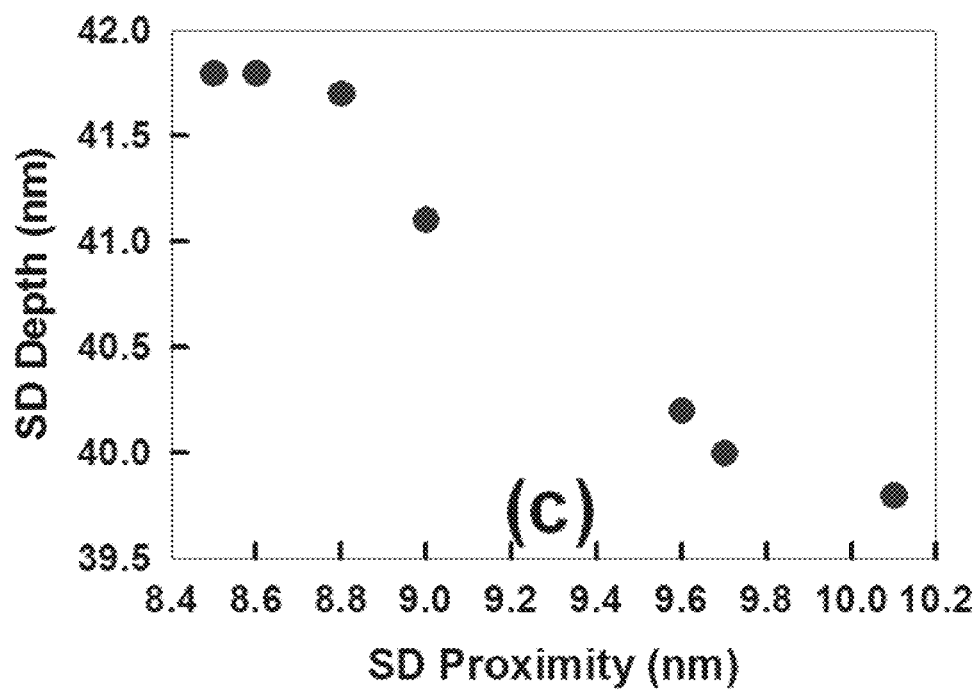
FIG. 4C verifies an aspect of the results shown in FIG. 3.

FIG. 4C shows the relationship between the S/D proximity and the S/D depth. As can be seen in FIG. 4C, there is indeed a better linear correlation between the S/D proximity and the S/D depth.

Figure 4D:
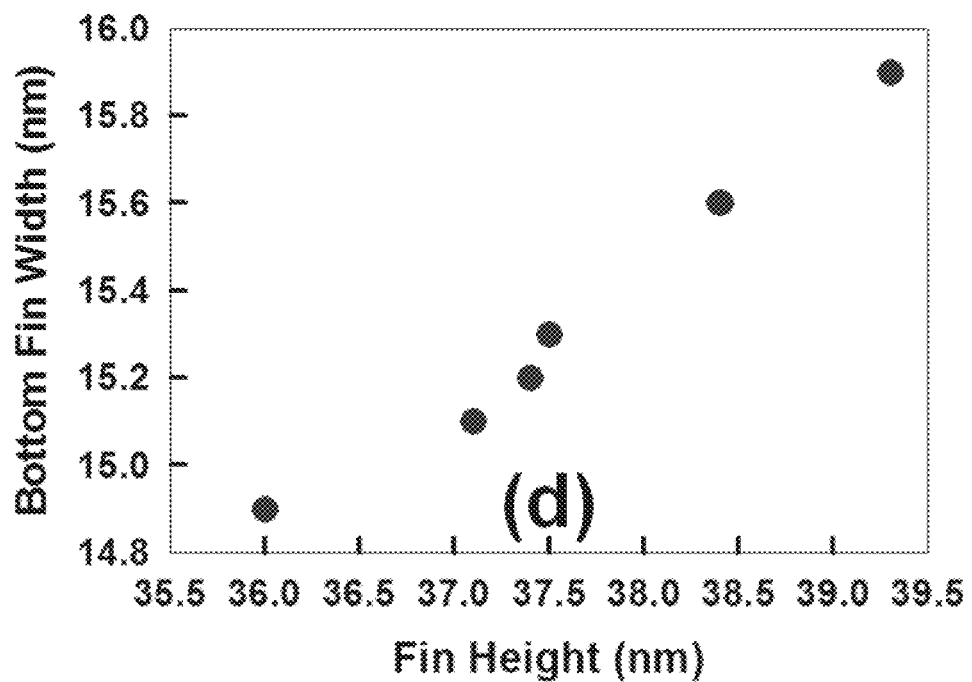
FIG. 4D verifies an aspect of the results shown in FIG. 3.

FIG. 4D shows the relationship between the fin height and the bottom-fin width. As can be seen in FIG. 4D, there is indeed a better linear correlation between the fin height and the bottom-fin width.

Accordingly, embodiments of the analysis methods provided by the present disclosure have been described for analyzing a plurality of process parameters for fabricating HKMG fin field effect transistors. Although the present disclosure has been described with respect to the specific exemplary embodiments, various modifications and changes may be made to these embodiments without departing from the broader spirit and scope of the disclosure. Accordingly, the specification and drawings are to be regarded in an illustrative meaning rather than a restrictive sense.

According to the analysis method provided by the present disclosure, by performing sensitive analysis on a plurality of process parameters for manufacturing a HKMG fin field effect transistor, key process parameters in a plurality of process parameters are obtained, and data mining is performed on a plurality of key process parameters, thereby it possible to highlight and group the relevant online process parameters. Through the analysis method provided by the disclosure, the source of the online process parameter change can be revealed, thereby providing the possibility for subsequent adjustment of the process and optimization of the process.

The present disclosure also provides a computer device comprising a memory, a processor, and a computer program stored on the memory and operable on the processor, the processor executing the computer program to implement the steps of the above method.

The present disclosure also provides a computer readable storage medium having stored there on a computer program that, when executed by a processor, implements the steps of the above method.

In some embodiments of the computer device and the computer readable storage medium can be understood by referring to the embodiments of the semiconductor device analysis method described above, and details are not described herein again.

In some embodiments, illustrative logic blocks, modules, circuits, and algorithm steps described in conjunction with the embodiments disclosed herein can be implemented as electronic hardware, computer software, or a combination of both. In order to illustrate the interchangeability between hardware and software, various illustrative components, frames, modules, circuits, and steps are generally described above in the form of functionalities thereof. Whether such functionalities are implemented as hardware or software is dependent on a specific application and design constrains imposed on the entire system. In some embodiments, implementation of the described functionalities in different manners for each particular application, but this implementation decision should not be construed as resulting in departing from the scope of the present disclosure.

The various illustrative logic modules, and circuits described in connection with the embodiments disclosed herein may be general purpose processors, digital signal processors (DSPs), application specific integrated circuits (ASICs), field programmable gate arrays (FPGAs), or other programmable logic devices, discrete gate or transistor logic, discrete hardware components, or any combination thereof designed to perform the functions described herein are implemented or executed. A general purpose processor may be a microprocessor, but in the alternative, the processor may be any conventional processor, controller, microcontroller, or state machine. The processor may also be implemented as a combination of computing devices, such as a combination of a DSP and a microprocessor, a plurality of microprocessors, one or more microprocessors in conjunction with a DSP core, or any other such configuration.

The steps of a method or algorithm described in connection with the embodiments disclosed herein may be embodied in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor to enable the processor to read and write information to/from the storage medium. In the alternative, the storage medium can be integrated into the processor. The processor and the storage medium can reside in an ASIC. The ASIC can reside in the user terminal. In the alternative, the processor and the storage medium may reside as a discrete component in the user terminal.

In one or more exemplary embodiments, the described functions can be implemented in hardware, software, firmware or their any combination. If they are implemented as a computer program product in software, then various functions can be stored in a computer readable medium as one or more instructions or codes or transported via same. The computer readable medium comprises both a computer storage medium and a communication medium, and comprises any medium facilitating a computer program to transfer from one place to another. The storage medium can be any available medium that can be accessed by a computer. As an example but not limitation, such a computer readable medium can comprise RAM, ROM, EEPROM, CD-ROM or other optical disk storages, magnetic disk storages or other magnetic storage device, or any other medium that can be used for carrying or storing appropriate program codes in the form of instructions or data structures and can be accessed by a computer. Any connection is also rightly called a computer readable medium. For example, if the software is transported from a web site, a server, or other remote sources using a coaxial-cable, an optical fibre cable, a twisted pair, a digital subscriber line (DSL), or wireless techniques such as infrared, radio, and microwave or anything like that, then the coaxial-cable, the optical fibre cable, the twisted pair, the DSL, or the wireless techniques such as infrared, radio, microwave or anything like that are included in the definition of medium. Disks and discs as used herein comprise a compact disc (CD), a laser disc, an optical disc, a digital versatile disc (DVD), a floppy disk and a blue-ray disc, and the disks often reproduce data magnetically, and the discs optically reproduce data with laser. Combinations of the forgoing should also be included in the range of the computer readable medium.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. An analysis method for a semiconductor device for analyzing a plurality of process parameters for manufacturing an HKMG fin field effect transistor, wherein the analysis method comprises:
    establishing a plurality of process parameter models by grouping the plurality of process parameters in pairs;
    performing sensitivity analysis on each of the process parameter models;
    extracting a plurality of key process parameter models from the plurality of process parameter models based on results of the sensitivity analysis; and
    performing data mining on the plurality of key process parameter models to determine correlations among a plurality of key process parameters of the plurality of process parameters; and
    determining one or more source process parameters and one or more subsequent process parameters in accordance with a sequence of manufacturing process, the one or more source process parameters being associated with the one or more subsequent process parameters;
    wherein the plurality of key process parameters comprises a bottom-fin width, a fin height, a gate-spacer-1 thickness, a gate-spacer-2 thickness, an S/D depth, an S/D proximity, an HK/IL thickness, a gate height, and/or the gate length.

2. The analysis method of claim 1, wherein performing the sensitivity analysis further comprises:
    calculating a covariance of each of the process parameter models; and
    calculating a correlation coefficient of each of the process parameter models based on the covariance.

3. The analysis method of claim 2, wherein extracting the plurality of key process parameter models further comprises:
    extracting from the plurality of process parameter models a process parameter model whose absolute value of the correlation coefficient is greater than a preset threshold as a key process parameter model.

4. The analysis method of claim 2, wherein the performing the data mining further comprises:
    performing the data mining based on correlation coefficients of the plurality of key process parameter models to determine correlations among the key process parameters.

5. The analysis method of claim 4, wherein performing the data mining based on correlation coefficients of the plurality of key process parameter models further comprises:
    establishing a correlation coefficient matrix of the plurality of key process parameter models by using the correlation coefficients of the plurality of key process parameter models as matrix elements; and
    determining the correlations among the key process parameters based on the correlation coefficient matrix.

6. The analysis method of claim 5, wherein determining the correlations among the key process parameters based on the correlation coefficient matrix further comprises:
    performing agglomerative hierarchical clustering based on the correlation coefficient matrix.

7. The analysis method of claim 5, wherein the correlation coefficient is a Pearson correlation coefficient, and the correlation coefficient matrix is a Pearson correlation coefficient matrix.

8. The analysis method of claim 1, wherein establishing the plurality of process parameter models further comprises:
    obtaining a plurality of specific values for each of the process parameters; and
    establishing the plurality of process parameter models based on the plurality of process parameters and respective corresponding plurality of specific values.

9. The analysis method of claim 1, wherein the analysis method further comprises:
    determining source process parameters based on the correlations among the key process parameters; and
    adjusting the source process parameters to optimize the plurality of process parameters.

10. A computer apparatus comprising a memory, a processor and a computer program stored on the memory and operable on the processor, wherein the processor executes the computer program to perform the steps of the analysis method according to claim 1.

11. An analysis method for a semiconductor device for analyzing a plurality of process parameters for manufacturing an HKMG fin field-effect transistor, wherein the analysis method comprises:
    defining the plurality of process parameters and obtaining a structural size distribution of the HKMG fin field-effect transistor based on online testing;
    establishing a plurality of process parameter models by grouping the plurality of process parameters in pairs;
    performing sensitivity analysis on each of the process parameter models;
    extracting a plurality of key process parameter models from the plurality of process parameter models based on results of the sensitivity analysis; and
    performing data mining on the plurality of key process parameter models to determine correlations among a plurality of key process parameters of the plurality of process parameters; and
    determining one or more source process parameters and one or more subsequent process parameters in accordance with a sequence of manufacturing process, the one or more source process parameters being associated with the one or more subsequent process parameters.

12. The analysis method of claim 11, wherein the plurality of key process parameters comprises a bottom-fin width, a fin height, a gate-spacer-1 thickness, a gate-spacer-2 thickness, an S/D depth, an S/D proximity, an HK/IL thickness, a gate height, and/or the gate length.

13. The analysis method of claim 12, wherein the bottom-fin width is associated with the fin height.

14. The analysis method of claim 12, wherein the gate-spacer-1 thickness is associated with the gate-spacer-2 thickness.

* * * * *